(12) United States Patent
Liu

(10) Patent No.: US 12,426,237 B2
(45) Date of Patent: Sep. 23, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Youming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 422 days.

(21) Appl. No.: 18/156,322

(22) Filed: Jan. 18, 2023

(65) Prior Publication Data

US 2023/0422469 A1     Dec. 28, 2023

Related U.S. Application Data

(63) Continuation of application No. PCT/CN2022/105101, filed on Jul. 12, 2022.

(30) Foreign Application Priority Data

Jun. 23, 2022   (CN) .............................. 202210726374

(51) Int. Cl.
H10B 12/00         (2023.01)

(52) U.S. Cl.
CPC ........... *H10B 12/053* (2023.02); *H10B 12/20* (2023.02); *H10B 12/482* (2023.02)

(58) Field of Classification Search
CPC .... H10B 12/053; H10B 12/20; H10B 12/482; H10D 30/873; H10D 30/015; H10D 30/023; H10D 30/024; H10D 30/0245; H10D 30/62; H10D 30/751; H10D 62/812; H10D 30/611; H10D 30/87; H10D 64/311

See application file for complete search history.

(56) References Cited

U.S. PATENT DOCUMENTS

| | | |
|---|---|---|
| 6,150,687 A | 11/2000 | Noble |
| 6,350,635 B1 | 2/2002 | Noble |
| 6,399,979 B1 | 6/2002 | Noble |
| 6,504,201 B1 | 1/2003 | Noble |
| 8,391,081 B2 | 3/2013 | Bawedin |

(Continued)

FOREIGN PATENT DOCUMENTS

| | | |
|---|---|---|
| CN | 1344029 A | 4/2002 |
| CN | 102544013 A | 7/2012 |

(Continued)

*Primary Examiner* — Moazzam Hossain
(74) *Attorney, Agent, or Firm* — SYNCODA LLC; Feng Ma

(57) ABSTRACT

A method for forming a semiconductor structure includes the following operations. A substrate is provided. The substrate includes double heterostructures arrayed along a first direction and a second direction. Each of the double heterostructures includes a first semiconductor layer, a second semiconductor layer and another first semiconductor layer sequentially arranged along the first direction. A forbidden band gap of the first semiconductor layer is different from a forbidden band gap of the second semiconductor layer. The first direction is perpendicular to the second direction, and both the first direction and the second direction are parallel to a direction of a plane where the substrate is located. A double gate structure is formed on sidewalls of each of the double heterostructures along the first direction.

18 Claims, 10 Drawing Sheets

(56) References Cited

U.S. PATENT DOCUMENTS

| | | |
|---|---|---|
| 2002/0034855 A1 | 3/2002 | Horiguchi |
| 2002/0149048 A1 | 10/2002 | Noble |
| 2010/0252816 A1 | 10/2010 | Ko |
| 2012/0153371 A1 | 6/2012 | Chen |
| 2014/0134815 A1 | 5/2014 | Ko et al. |
| 2014/0252459 A1 | 9/2014 | Yu |
| 2015/0072495 A1 | 3/2015 | Ko et al. |
| 2017/0170335 A1 | 6/2017 | Ko et al. |
| 2019/0198668 A1 | 6/2019 | Tang et al. |
| 2020/0052113 A1 | 2/2020 | Tang et al. |
| 2021/0091219 A1* | 3/2021 | Patti .................... H10D 30/478 |
| 2021/0265500 A1 | 8/2021 | Tang et al. |
| 2023/0397396 A1* | 12/2023 | Hsu ...................... H10D 30/711 |
| 2024/0121938 A1* | 4/2024 | Hsu ...................... H10D 30/711 |

FOREIGN PATENT DOCUMENTS

| | | |
|---|---|---|
| CN | 104051320 A | 9/2014 |
| CN | 107431072 A | 12/2017 |

\* cited by examiner

A substrate is provided. The substrate includes double heterostructures arrayed along a first direction and a second direction. Each of the double heterostructures includes a first semiconductor layer, a second semiconductor layer and another first semiconductor layer sequentially arranged along the first direction. A forbidden band gap of the first semiconductor layer is different from a forbidden band gap of the second semiconductor layer. The first direction is perpendicular to the second direction, and both the first direction and the second direction are parallel to a plane where the substrate is located ─ S101

A double gate structure is formed on sidewalls of each of the double heterostructures along the first direction ─ S102

FIG. 1

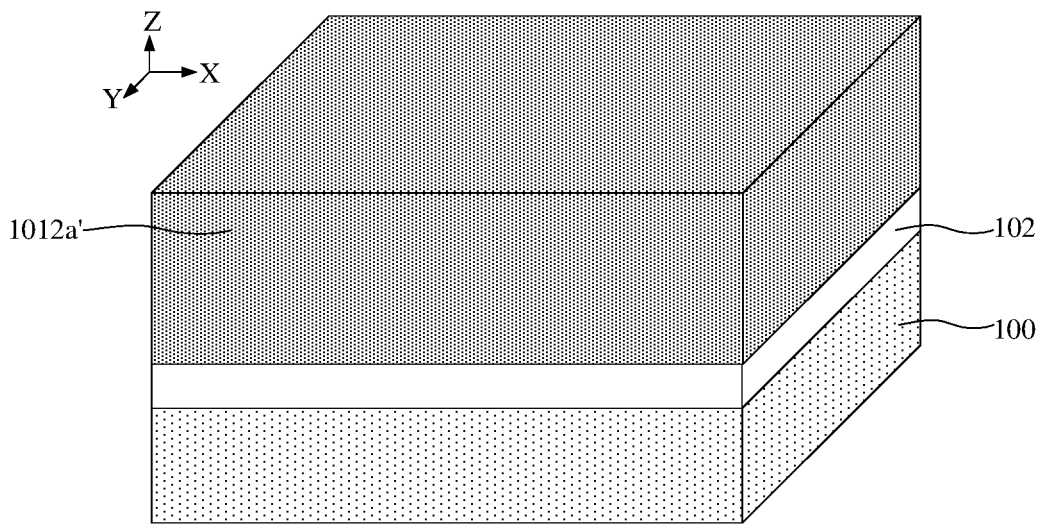

FIG. 2A

SEMICONDUCTOR STRUCTURE AND METHOD FOR FORMING SAME

CROSS-REFERENCE TO RELATED APPLICATIONS

This is a continuation application of International Application No. PCT/CN2022/105101 filed on Jul. 12, 2022, which claims priority to Chinese Patent Application No. 202210726374.6 filed on Jun. 23, 2022. The disclosures of the above-referenced applications are hereby incorporated by reference in their entirety.

BACKGROUND

Conventional 1T0C (i.e. 1 transistor, 0 capacitor) dynamic random access memory (DRAM) uses a floating body effect (FBE) of a vertical gate all around (VGAA) structure to store charges to cause drift of a threshold voltage ($V_t$), thereby distinguishing the driving circuit to distinguish "1" from "0". However, it is only possible for a floating body to store charges in theory, this is difficult to realize in practical application.

SUMMARY

Embodiments of the disclosure provide a semiconductor structure and a method for forming the same.

In the first aspect, the embodiments of the disclosure provide a method for forming a semiconductor structure. The method includes the following operations.

A substrate is provided. The substrate includes double heterostructures arrayed along a first direction and a second direction. Each of the double heterostructures includes a first semiconductor layer, a second semiconductor layer and another first semiconductor layer sequentially arranged along the first direction. A forbidden band gap of the first semiconductor layer is different from a forbidden band gap of the second semiconductor layer. The first direction is perpendicular to the second direction, and both the first direction and the second direction are parallel to a plane where the substrate is located.

A double gate structure is formed on sidewalls of each of the double heterostructures along the first direction.

In the second aspect, the embodiments of the disclosure provide a semiconductor structure formed by the method for forming a semiconductor structure. The semiconductor structure includes a substrate and double gate structures.

The substrate includes double heterostructures arrayed along a first direction and a second direction. Each of the double heterostructures includes a first semiconductor layer, a second semiconductor layer and another first semiconductor layer sequentially arranged along the first direction, a forbidden band gap of the first semiconductor layer is different from a forbidden band gap of the second semiconductor layer, the first direction is perpendicular to the second direction, and both the first direction and the second direction are parallel to a direction of a plane where the substrate is located.

A double gate structure is located on sidewalls of each of the double heterostructures along the first direction.

BRIEF DESCRIPTION OF THE DRAWINGS

In the accompany drawings (which are not necessarily drawn to scale), similar reference numerals may describe like components in different views. Similar reference numerals with different letter suffixes may denote different examples of similar components. The accompanying drawings generally illustrate the various embodiments discussed herein in an illustration way, rather than a limitation way.

FIG. 1 is a flowchart of a method for forming a semiconductor structure provided by the embodiments of the disclosure.

FIG. 2A is a first schematic diagram of a structure during a forming process of a semiconductor structure provided by an embodiment of the disclosure.

DETAILED DESCRIPTION

Figure 2B:
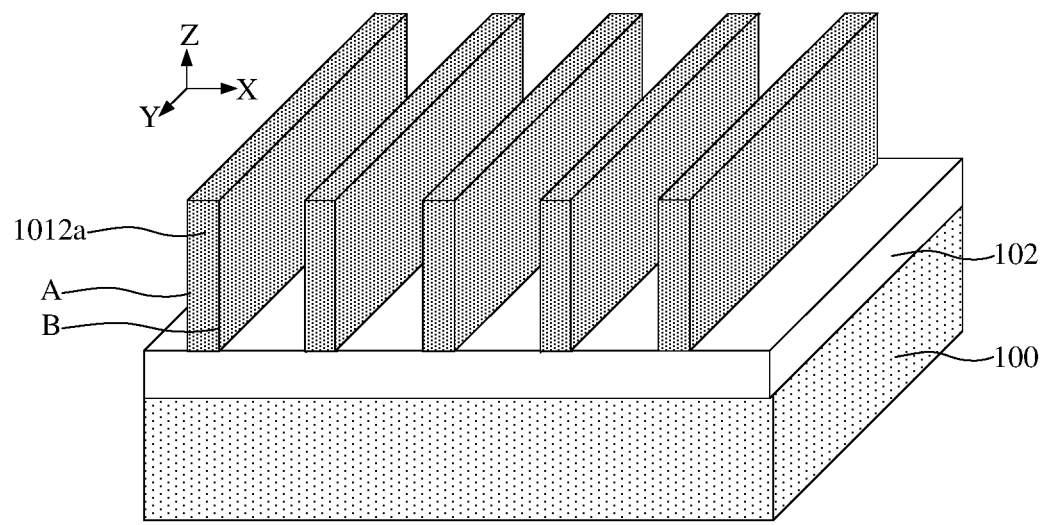
FIG. 2B is a second schematic diagram of a structure during a forming process of a semiconductor structure provided by an embodiment of the disclosure.

The disclosure relates to the technical field of semiconductors, and relates to but is not limited to a semiconductor structure and a method for forming the same.

Exemplary embodiments of the disclosure will be described in more detail below with reference to the accompanying drawings. Although the exemplary embodiments of the disclosure are shown in the accompanying drawings, it is to be understood that the disclosure may be implemented in various forms and should not be limited by the specific embodiments set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure, that is, all features of the actual embodiments are not described herein and well-known functions and structures are not described in detail.

In the drawings, the dimensions of layers, regions, elements and their relative dimensions may be exaggerated for clarity. The same reference numerals denote the same elements throughout.

It should be understood that when an element or layer is referred to as "above", "adjacent to", "connected to" or "coupled to" another element or layer, it may be directly above, adjacent to, connected to, or coupled to the other element or layer, or may exist intervening elements or layers. Conversely, when an element is called "directly above", "directly adjacent to", "directly connected to" or "directly coupled to" another element or layer, there is no intervening element or layer. It should be understood that, although the terms first, second, third, etc. may be used to describe various elements, components, regions, layers, and/or portions, the elements, components, regions, layers, and/or portions should not be limited by such terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

The terminology used herein is intended to describe specific embodiments only and is not to be a limitation of the disclosure. As used herein, the singular forms of "a", "an" and "said/the" are also intended to include the plural forms, unless the context clearly indicates otherwise. It should also be understood that the terms "compose" and/or "include", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

Embodiments of the disclosure provide a method for forming a semiconductor structure. FIG. 1 is a flowchart of a method for forming a semiconductor structure provided by the embodiments of the disclosure. As shown in FIG. 1, the method for forming a semiconductor structure includes operations S101 and S102.

In S101, a substrate is provided. The substrate includes double heterostructures arrayed along a first direction and a second direction. Each of the double heterostructures includes a first semiconductor layer, a second semiconductor layer and another first semiconductor layer sequentially arranged along the first direction. A forbidden band gap of the first semiconductor layer is different from a forbidden band gap of the second semiconductor layer. The first direction is perpendicular to the second direction, and both the first direction and the second direction are parallel to a plane where the substrate is located.

The substrate may include a top surface at a front side and a bottom surface opposite to the front side. In the case of ignoring flatness of the top surface and the bottom surface, two directions perpendicular to each other, the first direction and the second direction, can be defined on the plane where the substrate is located. A direction perpendicular to the top surface and the bottom surface of substrate is defined as a third direction. In the embodiments of the disclosure, the first direction is defined as an X-axis direction, the second direction is defined as a Y-axis direction, and the third direction is defined as a Z-axis direction.

In the embodiments of the disclosure, each of the double heterostructures is a sandwich-like structure composed of three semiconductor layers arranged sequentially. The three semiconductor layers forming the double heterostructure may be all different, or two layers at edges layer may be the same. For example, the two semiconductor layers located at the outer sides are the same, and the semiconductor layer in the middle is different from the semiconductor layers at the outer sides.

In the embodiments of the disclosure, the forbidden band gap of the first semiconductor layer and the forbidden band gap of the second semiconductor layer in each of the double heterostructures are $E_{g1}$ and $E_{g2}$, respectively, and $E_{g1} > E_{g2}$. The second semiconductor layer with the forbidden band gap of $E_{g2}$ is sandwiched by the first semiconductor layers with the forbidden band gap of $E_{g1}$ to form a potential well. By doing so, in the double heterostructure, the first semiconductor layers can be used as channels, and the second semiconductor layer can be used as a trap to trap electrons or holes, thereby enabling each of the double heterostructures to be used as a charge storage bank.

In embodiments of the disclosure, the first semiconductor layer may be a silicon layer, or may also include a semiconductor compound such as silicon carbide, gallium arsenide, gallium phosphide, indium phosphide, indium arsenide or indium antimonide, or other semiconductor alloys such as silicon germanide, arsenic gallium phosphide, indium aluminum arsenide, gallium aluminum arsenide, indium gallium arsenide, indium gallium phosphide, and/or indium gallium arsenide phosphide or combinations thereof. The second semiconductor layer may be germanium, silicon germanium, silicon carbide, or the like, or may also be silicon-on-insulator (SOI) or germanium-on-insulator (GOI). In the embodiments of the disclosure, description is made by taking a silicon layer as the first semiconductor layer and a germanium-silicon layer as the second semiconductor layer, that is, the double heterostructure includes a silicon layer/a germanium-silicon layer/a silicon layer, as an example.

In embodiments of the disclosure, a thickness of the first semiconductor layer may be 2 to 20 nanometers (nm), and a thickness of the second semiconductor layer may be 2 to 10 nm.

In embodiments of the disclosure, each of the double heterostructures includes two PN junctions of the same type. For example, the first semiconductor layers may be P-type doped silicon layers, and the second semiconductor layer may be a P-type doped silicon-germanium layer. Since majority carriers of P-type doped semiconductors are holes, channels storing charges can be increased.

In S102, a double gate structure is formed on sidewalls of each of the double heterostructures along the first direction.

In embodiments of the disclosure, the double heterostructure has two sidewalls along the first direction. One gate structure is formed in each of the sidewalls, a double gate structure, two gates of which are arranged in the first direction, thus is formed. One gate in the double-gate structure may be used as a traditional switching device, to control on and off of a transistor, and the other gate in the double-gate structure can generate a floating body memory cell. The memory cell operates by reversing voltage of this gate, such that programming, erasing, reading and storing of data can be realized.

In the embodiments of the disclosure, on one hand, since forbidden band gaps of the first semiconductor layer and the second semiconductor layer forming each of the double heterostructures are different, and the first semiconductor layers in the double heterostructure can be used as channels, the second semiconductor layer can be used as a trap to trap electrons or holes, thereby enabling the double heterostructure to be used as a charge storage bank. Therefore, redundant holes can be accumulated in a channel body of one gate structure in the double gate structure, which greatly increases a holding time, and further greatly enhances feasibility of 1T0C. On another hand, because the double heterostructures in the embodiments of the disclosure can be used as charge storage banks and can store data, there is no need to provide additional capacitors in the semiconductor structure, so that the integration of the semiconductor structure can be improved, and miniaturization can be realized.

Figure 2C:
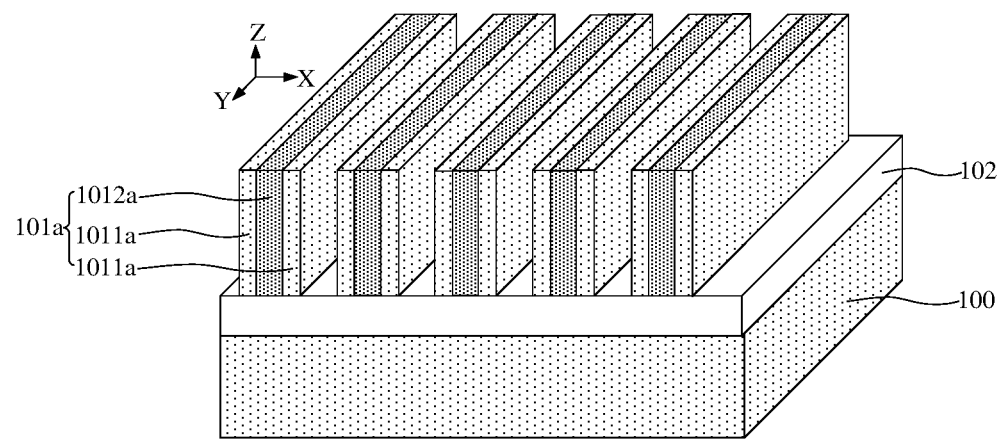
FIG. 2C is a third schematic diagram of a structure during a forming process of a semiconductor structure provided by an embodiment of the disclosure.
Figure 2D:
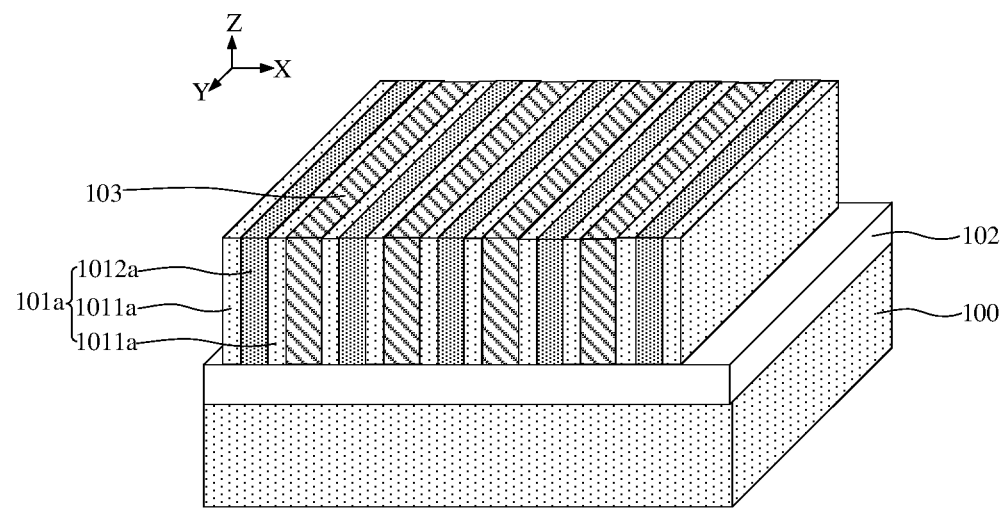
FIG. 2D is a fourth schematic diagram of a structure during a forming process of a semiconductor structure provided by an embodiment of the disclosure.
Figure 2E:
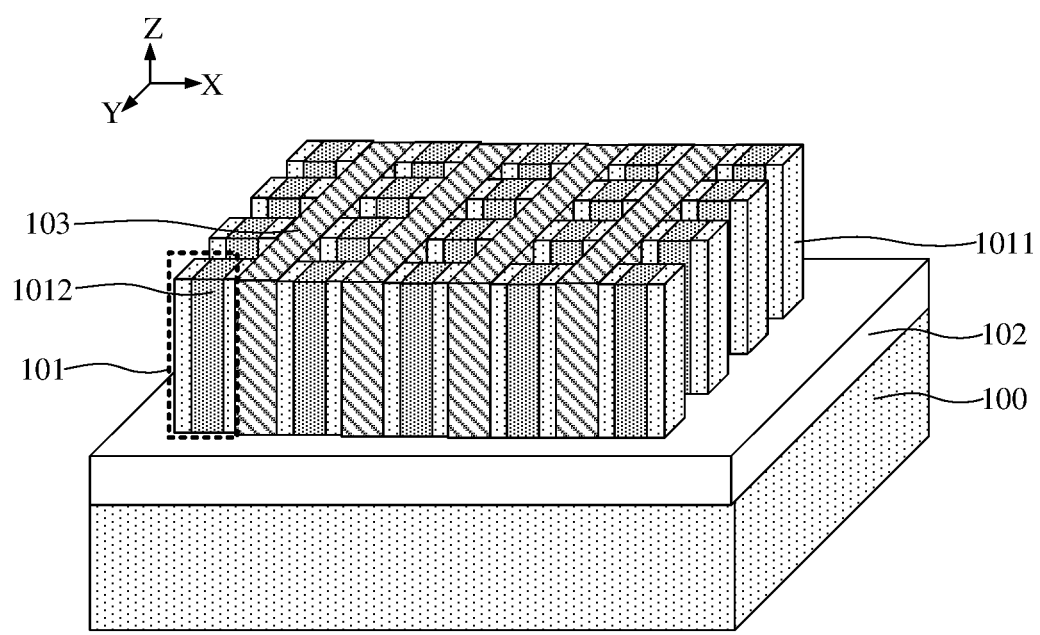
FIG. 2E is a fifth schematic diagram of a structure during a forming process of a semiconductor structure provided by an embodiment of the disclosure.
Figure 2F:
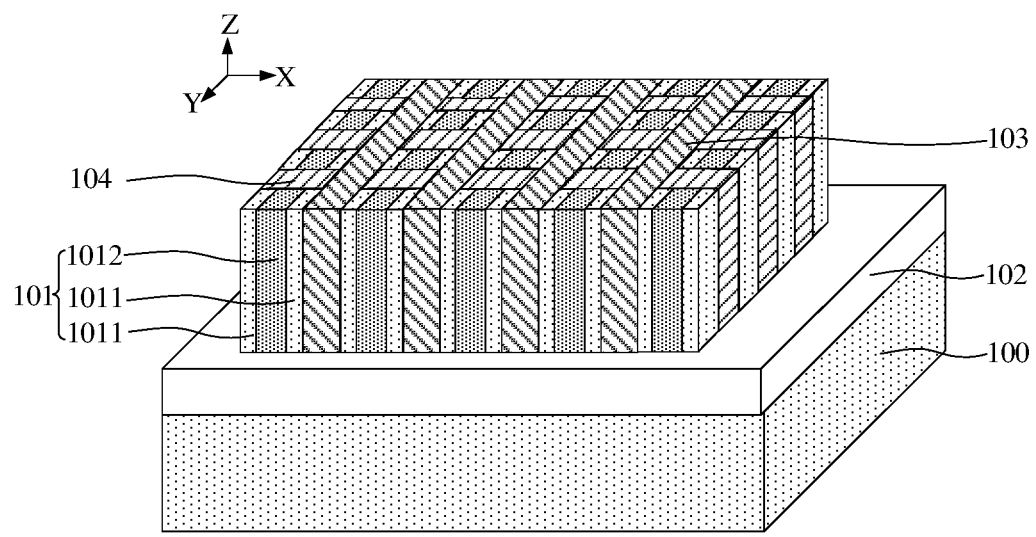
FIG. 2F is a sixth schematic diagram of a structure during a forming process of a semiconductor structure provided by an embodiment of the disclosure.
Figure 2G:
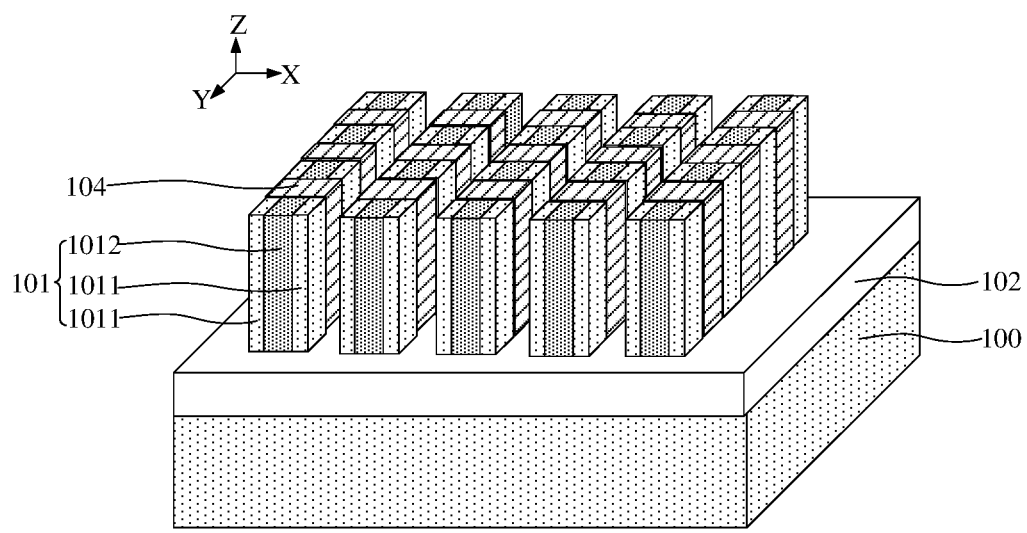
FIG. 2G is a seventh schematic diagram of a structure during a forming process of a semiconductor structure provided by an embodiment of the disclosure.
Figure 2H:
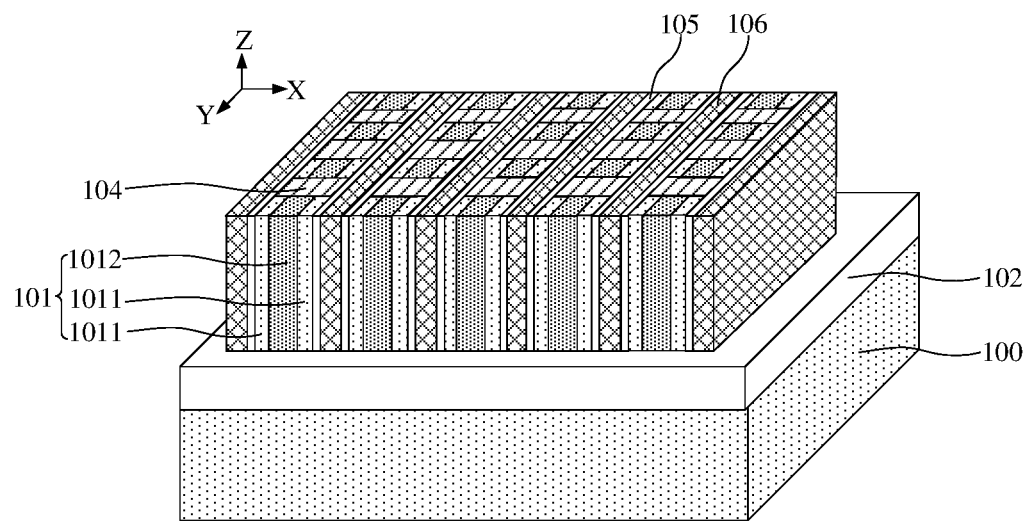
FIG. 2H is an eighth schematic diagram of a structure during a forming process of a semiconductor structure provided by an embodiment of the disclosure.
Figure 2I:
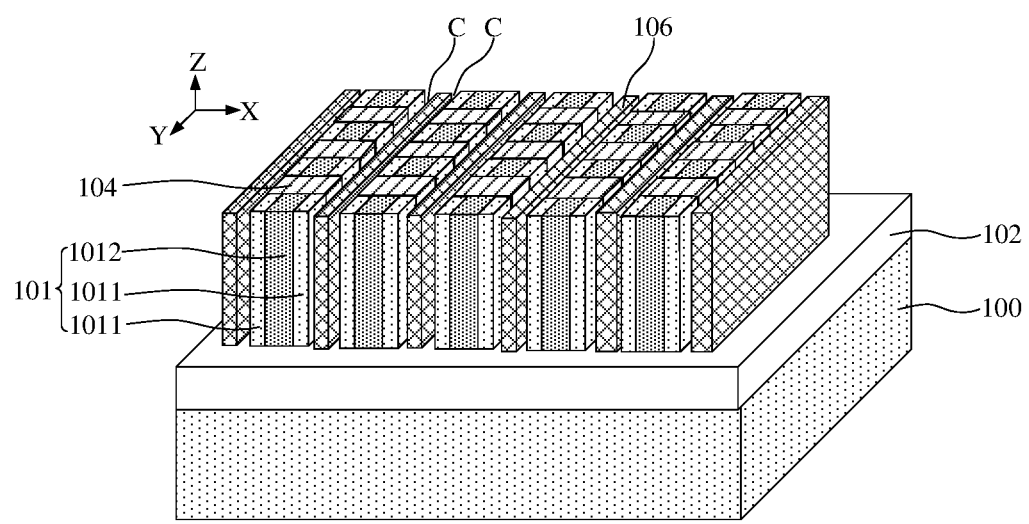
FIG. 2I is a ninth schematic diagram of a structure during a forming process of a semiconductor structure provided by an embodiment of the disclosure.
Figure 2J:
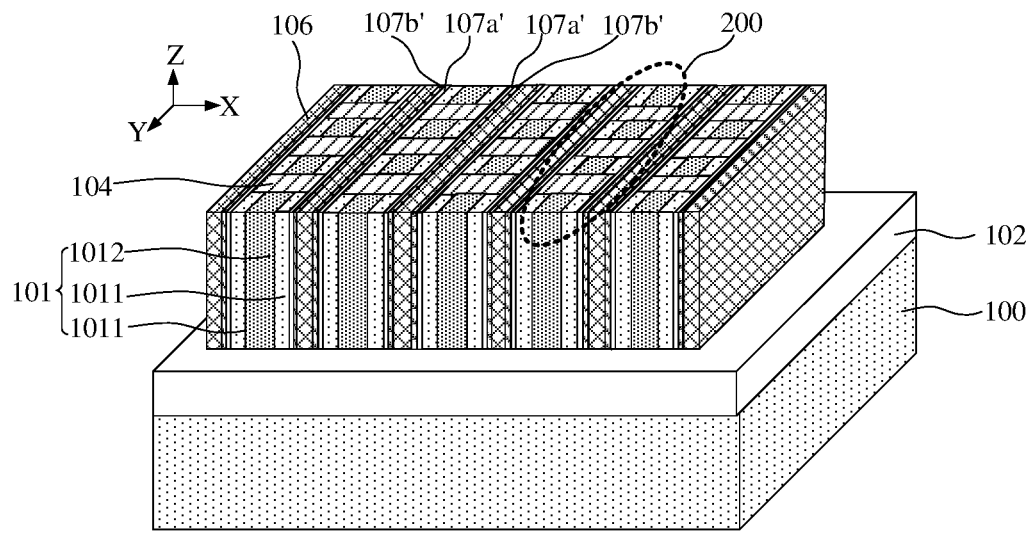
FIG. 2J is a tenth schematic diagram of a structure during a forming process of a semiconductor structure provided by an embodiment of the disclosure.
Figure 2K:
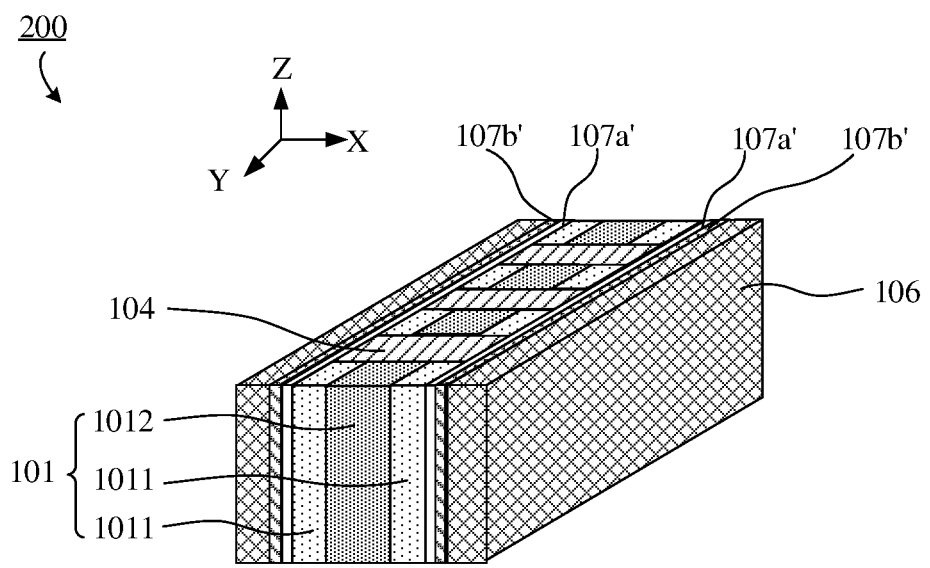
FIG. 2K is an enlarged view of a dashed portion 200 in FIG. 2J.
Figure 2L:
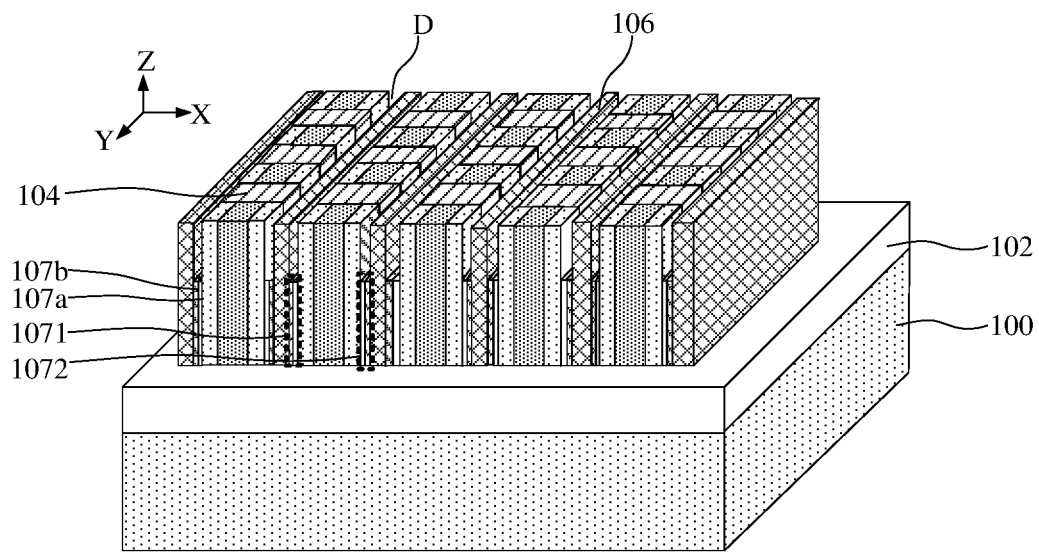
FIG. 2L is an eleventh schematic diagram of a structure during a forming process of a semiconductor structure provided by an embodiment of the disclosure.
Figure 2M:
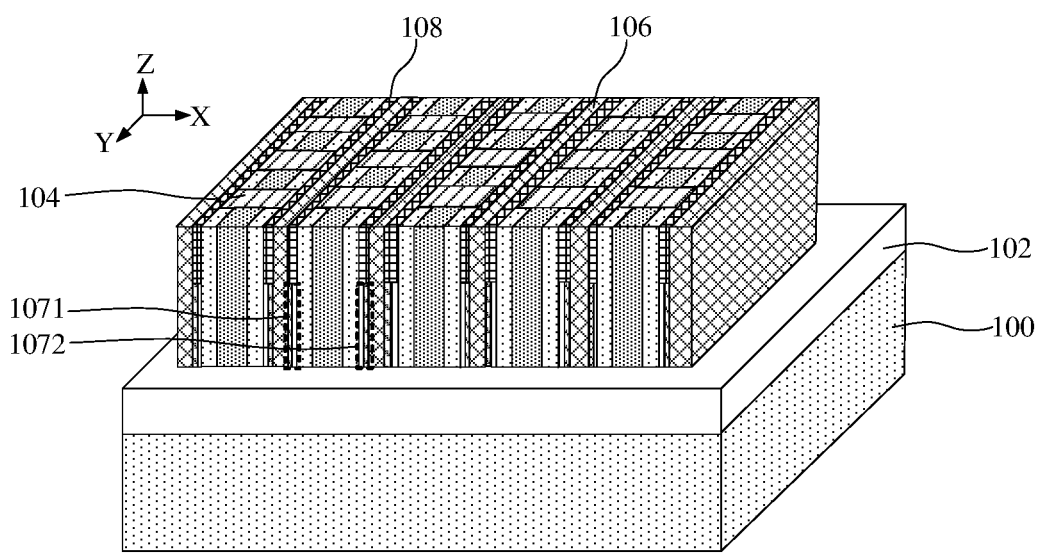
FIG. 2M is a twelfth schematic diagram of a structure during a forming process of a semiconductor structure provided by an embodiment of the disclosure.
Figure 2N:
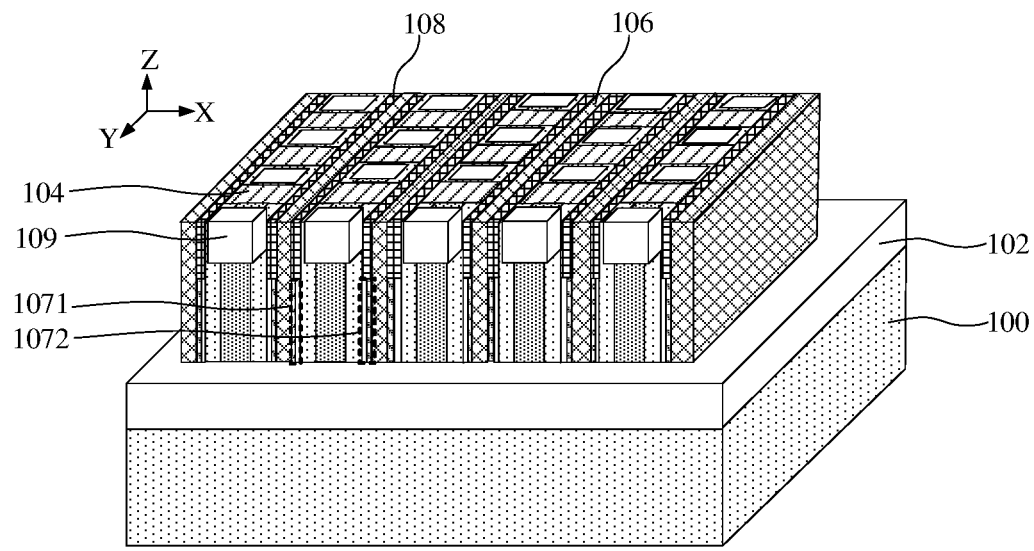
FIG. 2N is a thirteenth schematic diagram of a structure during a forming process of a semiconductor structure provided by an embodiment of the disclosure.
Figure 2O:
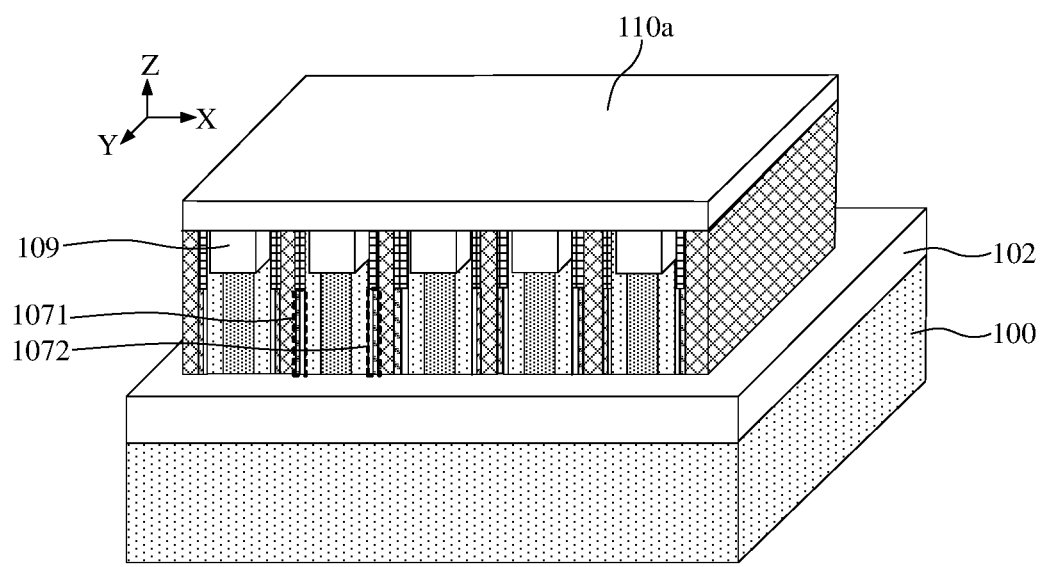
FIG. 2O is a fourteenth schematic diagram of a structure during a forming process of a semiconductor structure provided by an embodiment of the disclosure.
Figure 2P:
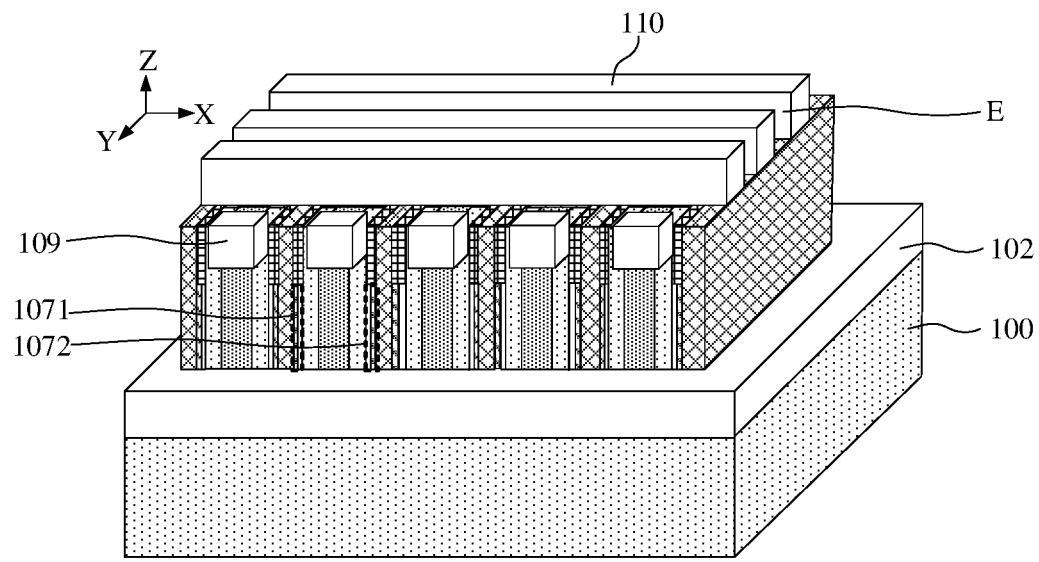
FIG. 2P is a fifteenth schematic diagram of a structure during a forming process of a semiconductor structure provided by an embodiment of the disclosure.
Figure 2Q:
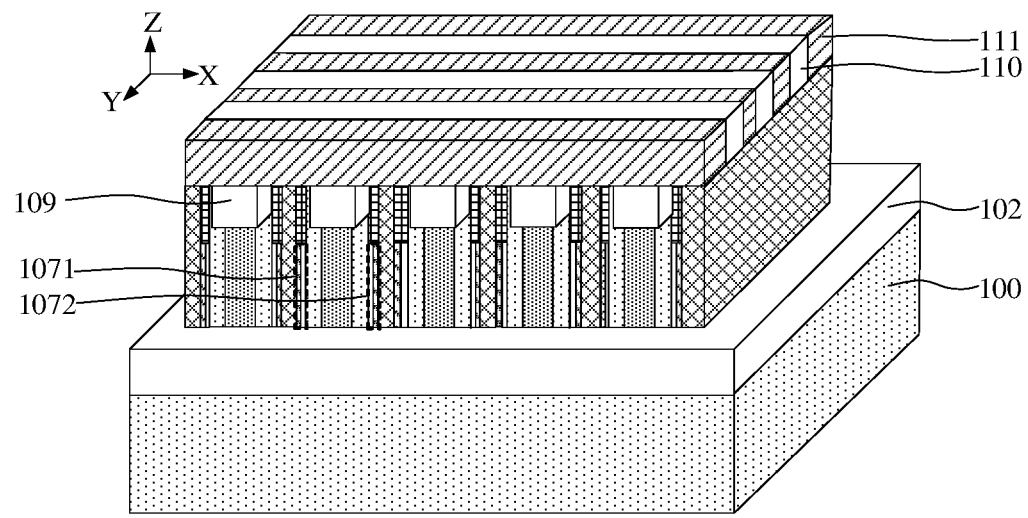
FIG. 2Q is a sixteenth schematic diagram of a structure during a forming process of a semiconductor structure provided by an embodiment of the disclosure.

FIGS. 2A to 2Q are schematic diagrams of structures during a process for forming a semiconductor structure provided by an embodiment of the disclosure. The process for forming the semiconductor structure provided by the embodiment of the disclosure is described in detail with reference to FIGS. 2A to 2Q.

Referring to FIGS. 2A to 2G, S101 is performed. A substrate 100 is provided. The substrate includes double heterostructures 101 arrayed along a first direction (an X direction) and a second direction (a Y direction). Each of the double heterostructures 101 includes a first semiconductor layer 1011, a second semiconductor layer 1012 and another first semiconductor layer 1011 sequentially arranged along the first direction. A forbidden band gap $E_{g1}$ of the first semiconductor layer 1011 is different from a forbidden band gap $E_{g2}$ of the second semiconductor layer.

In some embodiments, there may be quantum wells in the double heterostructures 101, which may improve capability to trap charges, thereby achieving better charge storage effects.

In some embodiments, the substrate 100 further includes a source layer 102 which forms a source of the semiconductor structure. The double heterostructures 101 are formed on a surface of the source layer 102. The double heterostructures 101 are formed by the following operations. Initial double heterostructures 101a arranged at intervals along the first direction are formed on the surface of the source layer 102. The initial double heterostructures 101a are etched by a self-aligned double patterning technique or a self-aligned quadruple patterning technique, to form the double heterostructures 101 arrayed along the first direction and the second direction.

In some embodiments, the initial double heterostructures 101a may be formed by the following operations. Initial second semiconductor layers 1012a arranged along the first direction and extending in the second direction are formed on the surface of the source layer 102. Initial first semiconductor layers 1011a are formed on sidewalls of each of the initial second semiconductor layers 1012a epitaxially along the first direction to form the initial double heterostructure 101a.

As shown in FIGS. 2A and 2B, the initial second semiconductor layers 1012a may be formed by the following operations. An initial second semiconductor material layer 1012a' is formed epitaxially on the source layer 102. Next, the initial second semiconductor material layer 1012a' is etched by a self-aligned double patterning technique or a self-aligned quadruple patterning technique, to obtain the initial second semiconductor layers 1012a arranged along the X-axis direction and extending in the Y-axis direction as shown in FIG. 2B. Each of the initial second semiconductor layers 1012a has two sidewalls in the X-axis direction, that is, a sidewall A and a sidewall B. The initial first semiconductor layers 1011a as shown in FIG. 2C are formed epitaxially on surfaces of the sidewall A and the sidewall B of the initial second semiconductor layer 1012a to form the initial double heterostructure 101a.

In embodiments of the disclosure, excellent control effects on line width and spacing can be achieved by forming the initial second semiconductor layers by a self-aligned double patterning technique or a self-aligned quadruple patterning technique.

It should be noted that when the initial first semiconductor layers 1011a are formed on the sidewall A and the sidewall B epitaxially, a top surface of the formed initial first semiconductor layer 1011a may be higher than a top surface of the initial second semiconductor layer 1012a, the initial first semiconductor layers 1011a are formed even at bottoms of trenches between the adjacent initial second semiconductor layers 1012a. Because part of the surface of the source layer needs to be exposed between two adjacent initial double heterostructures to form double gate structures in subsequent processes and top surfaces of the initial double heterostructures need to be in a same plane to form other structures above the initial double heterostructures subsequently it is necessary to etch back the initial first semiconductor layers 1011a and the initial first semiconductor layers 1011a at the bottoms of the trenches to expose the initial second semiconductor layers 1012a and the source layer 102. A dry etching or a wet etching technique may be adopted for the back etching. Where a dry etching is used, a preset height or thickness of the initial second semiconductor layers can be etched by controlling etching time. Where a wet etching is used, an etching rate of the initial first semiconductor layers 1011a is greater than etching rates of the source layer 102 and the initial second semiconductor layers 1012a under the same etching conditions, such that the redundant initial first semiconductor layers 1011a can be removed.

Since the double gate structure needs to be subsequently formed on the sidewalls of the double heterostructure along the first direction, it is necessary to form first sacrificial layers between two adjacent ones of the initial double heterostructures after forming the initial double heterostructures and before forming the double heterostructures, so that the first sacrificial layers can occupy space for forming the double gate structures and can be removed when the double gate structures are formed subsequently.

As shown in FIG. 2D, a first sacrificial layer 103 is formed between two adjacent ones of the initial double heterostructures 101a. The first sacrificial layers 103 are arranged in the X-axis direction and extend in the Y-axis direction.

In embodiments of the disclosure, the first sacrificial layers 103 may be formed by any suitable deposition process, for example, a chemical vapor deposition process, a physical vapor deposition (PVD) process, an atomic layer deposition (ALD) process, a spin coating process, a coating process, or a furnace process.

A material of the first sacrificial layer 103 may be at least one of silicon dioxide ($SiO_2$), silicon nitride (SiN), silicon oxynitride (SiON), amorphous carbon (a-C), or silicon oxycarbonitride (SiOCN).

Referring to FIGS. 2D and 2E, the initial double heterostructures 101a are etched by a self-aligned double patterning technique or a self-aligned quadruple patterning technique to form the double heterostructures 101 arrayed along the X-axis direction and the Y-axis direction. A first sacrificial layer 103 is provided between two adjacent ones of the double heterostructures 101 in the X-axis direction, and a trench is formed between two adjacent ones of the double heterostructures 101 in the Y-axis direction.

It is to be noted that, when the double heterostructures 101 are formed, each first sacrificial layer 103 is not etched away (the first sacrificial layer 103 is continuous in the Y-axis direction as shown in FIG. 2E). This is because the double gate structures are formed at positions of the first sacrificial layers 103 subsequently. The word line structures of the memory cells at each row or column in the semiconductor structure are electrically connected, so the first sacrificial layers 103 are not removed when the double heterostructures are formed.

As shown in FIG. 2F, since each of the double heterostructures form a memory cell subsequently, in order to reduce an influence between two adjacent ones of the double heterostructures in the second direction, in some embodiments, after forming the double heterostructures, the method for forming the semiconductor structure further includes the following operations. A first isolation layer 104 is formed between two adjacent ones of the double heterostructures 101 in the Y-axis direction. The first isolation layer 104 is used to isolate the two adjacent double heterostructures 101, such that conduction between two adjacent double heterostructures 101 can be reduced, and performance of the semiconductor structure can be improved.

In embodiments of the disclosure, a material of the first isolation layers 104 may be an oxide, a nitride, an oxynitride, or the like, for example, silicon nitride. The first isolation layers 104 may be formed using the same process as the first sacrificial layers 103. For example, the first isolation layers 104 may be formed by atomic layer deposition.

In some embodiments, as shown in FIG. 2G, after forming the first isolation layers 104, the method for forming the semiconductor structure further includes the following operation. The first sacrificial layers 103 are removed. The first sacrificial layers 103 may be removed by a wet etching technique or a dry etching technique (e.g. a plasma etching technique, an ion milling technique or a reactive ion etching technique). A gas used in dry etching may be at least one of trifluoromethane ($CHF_3$), carbon tetrafluoride ($CF_4$), difluoromethane ($CH_2F_2$), hydrobromic acid (HBr), chlorine gas ($Cl_2$) or sulfur hexafluoride ($SF_6$). A solution used in wet etching may be a mixed solution of diluted hydrofluoric acid (DHF) and ammonia water ($NH_4OH$), or a mixed solution including diluted hydrofluoric acid and tetramethyl ammonium hydroxide (TMAH).

Referring to FIGS. 2H to 2L, S102 is performed. A double gate structure is formed on sidewalls of each of the double heterostructures along the first direction.

In some embodiments, the double gate structures 107 may be formed by the following operations. Second sacrificial layers 105 are formed on sidewalls of the double heterostructures 101 and the first isolation layers 104. A second isolation layer 106 is formed between two adjacent ones of the second sacrificial layers 105. The second sacrificial layers 105 are removed to form gate trenches C. In the gate trenches C, the double gate structures 107 are formed.

As shown in FIG. 2H, the second sacrificial layers 105 are formed on the sidewalls of the double heterostructures 101 and on the sidewalls of the first isolation layers 104, and the second isolation layer 106 is formed between two adjacent ones of the second sacrificial layers 105.

In embodiments of the disclosure, a material of the second sacrificial layer 105 may include at least one of silicon dioxide, silicon nitride, silicon oxynitride, amorphous carbon or silicon oxycarbonitride. A material of the second isolation layer 106 may include at least one of an oxide, a nitride, an oxynitride, or the like, for example, silicon nitride. The second sacrificial layers 105 and the second isolation layers 106 may be formed by the same process as the first sacrificial layers 103. For example, the process may be atomic layer deposition.

In some embodiments, the double heterostructures 101 and corresponding e first isolation layers 104 in the second direction form continuous structures, and the second isolation layers may also be formed by the following operations. A sacrificial material is filled between the adjacent continuous structures. Part of the sacrificial material is removed by etching to form trenches. The trenches are filled with an isolation material to form the second isolation layers.

In embodiments of the disclosure, on one hand, the second isolation layers can be used to isolate the adjacent gates in the double gate structures, so as to reduce conductions of the adjacent gate structures, thereby realizing control of a single transistor. On the other hand, isolation between the double gate structures and the subsequently formed bit line structures can also be realized.

As shown in FIG. 2I, the second sacrificial layers 105 are removed and the gate trenches C are formed on both sides of the second isolation layer 106. In embodiments of the disclosure, the second sacrificial layers 105 may be removed by a wet etching technique or a dry etching technique (e.g. a plasma etching technique, an ion milling technique or a reactive ion etching technique) with a high selectivity ratio.

In some embodiments, each of the double gate structures 107 includes a first gate structure 1071 and a second gate structure 1072. In the gate trenches C, forming the double gate structures 107 may include the following operations.

Referring to FIGS. 2I, 2J, and 2K, FIG. 2K is an enlarged view of a dashed portion 200 in FIG. 2J. Initial gate oxide layers 107a' are formed on the sidewalls of each of the double heterostructures 101. An initial gate conductive layer 107b' is formed in each gate trench having the initial gate oxide layer 107a'.

The initial gate oxide layers 107a' and the initial gate conductive layers 107b' are etched back to expose part of the sidewalls of the double heterostructures 101, part of sidewalls of the first isolation layers 104 and part of sidewalls of the second isolation layer 106, and form isolation grooves D and the first gate structures 1071 and the second gate structures 1072 as shown in FIG. 2L, both the first gate structure 1071 and the second gate structure 1072 are composed of the gate oxide layers 107a and the gate conductive layers 107b.

In embodiments of the disclosure, the initial gate oxide layers 107a' and the initial gate conductive layers 107b' may be etched back by a dry or wet etching technique to form the gate oxide layers 107a and the gate conductive layers 107b.

It is to be noted that a material of the initial gate oxide layer 107a' may be an oxide, a high-k material or the like. The oxide may be silicon oxide. The high-k material may include a hafnium-based material, such as hafnium dioxide ($HfO_2$), hafnium silicate ($HfSiO_x$), hafnium oxynitride (HfON), hafnium silicon oxynitride (HfSiON), aluminium hafnium oxide ($HfAlO_x$), a combination thereof and/or other suitable materials, such as aluminum oxide ($Al_2O_3$), zirconia ($ZrO_2$), zirconium silicon oxide ($ZrSiO_x$), tantalum pentoxide ($Ta_2O_5$), lanthanum trioxide ($La_2O_3$) and nitrides of the above materials, oxynitrides of the above materials, other rare earth element oxides, other rare earth element nitrides. The initial gate conductive layer may be of a metallic material or polysilicon or the like, such as tungsten (W), cobalt (Co), copper (Cu), aluminum (Al), molybdenum (Mo), ruthenium (Ru), titanium nitride (TiN), titanium-containing metal, polysilicon or any combination thereof.

The initial gate oxide layers and the initial gate conductive layers may be formed by a chemical vapor deposition process, a physical vapor deposition process, an atomic layer deposition process, a spin coating process, a coating process, or a furnace process. Where the initial gate oxide layers are of silicon oxide, since the first semiconductor layers in the double heterostructures may be silicon layers, part of each of the first semiconductor layers may also be oxidized by a thermal oxidation process to form the initial gate oxide layer, which can simplify the process flow.

In embodiments of the disclosure, by using a high-k material as the gate oxide layers, leakage current of the gate structures caused by electrons in substrate crossing the gate oxide layers into the gate structures in quantum form can be reduced. In other words, a quantum tunneling effect of the gate oxide layers can be reduced, thereby reducing the leakage current of the gate structures and a power consumption caused by the leakage current.

In some embodiments, referring to FIG. 2M, after forming the double gate structures 107, the method for forming the semiconductor structure further includes the following operation.

Third isolation layers 108 are formed in the isolation grooves D.

A top surface of the third isolation layer 108 is flush with a top surface of the double heterostructure 101 (or the first isolation layer 104 or the second isolation layer 106), so that a surface of the semiconductor structure formed is planar, which facilitates a subsequent formation of other structures on the surface of the semiconductor structure.

In some embodiments, the method for forming the semiconductor structure further includes the following operations. A drain is formed at an end of each of the double heterostructures away from the source layer. Bit line structures connected to the drains are formed.

Referring to FIG. 2N, the ends of the double heterostructures 101 away from the source layer 102 may be ion-implanted with a preset concentration of ions to form the drains 109. The implanted ions may be phosphorus, arsenic, antimony and other ions of group VA. The implanted ions may also be group IIIA ions such as boron and indium. Ion implantation may be realized by thermal diffusion and plasma doping. Energy and a dose used in the ion implantation process and a type of the implanted ions can be determined according to electrical properties of the semiconductor devices to be formed.

In some embodiments, after the ion implantation, the method may also include a high temperature annealing process. On one hand, the high temperature annealing process can activate impurity ions in ion implantation regions and redistribute the impurity ions. On the other hand, the high temperature annealing process can repair lattice damage caused by the ion implantation.

In some embodiments, as shown in FIGS. 2O to 2Q, the method for forming the bit line structures may include the following operations. A fourth initial isolation layer 110a is formed on surfaces of the first isolation layers 104, the second isolation layers 106, the third isolation layers 108 and the drains 109. The fourth initial isolation layer 110a is etched to form bit line trenches E and fourth isolation layers 110 arranged in the second direction and extending in the first direction. The bit line trenches E expose the drains 109, part of the second isolation layers 106 and part of the third isolation layers 108. The bit line structures 111 are formed in the bit line trenches E.

In embodiments of the disclosure, a fourth initial isolation material may be deposited on the surfaces of the first isolation layers 104, the second isolation layers 106, the third isolation layers 108, and the drains 109. The fourth initial isolation material may be, for example, an oxide (such as silicon dioxide), a nitride (such as silicon nitride), an oxynitride (such as silicon oxynitride), or the like. The fourth initial isolation material may be deposited by any of the following processes: a chemical vapor deposition process, a physical vapor deposition process, or an atomic layer deposition process. The fourth isolation layers 110 are used to isolate the adjacent bit line structures 111, to prevent the adjacent bit line structures 111 from conducting.

In some embodiments, the method for forming the semiconductor structure further includes forming a connection layer (not shown in the figures) between the bit line structure 111 and corresponding drains 109.

In embodiments of the disclosure, the connecting layer may be of a metal silicide. A layer of metal (such as titanium, cobalt or nickel, etc.) may be deposited on the drains 109, and then a rapid thermal annealing (RTA) may be performed at a lower temperature (such as 450 to 600 degrees Celsius), so that the metal reacts with silicon in the drains 109 to generate a metal silicide with high resistivity. Then non-reactive metals may be removed by selective wet etching. Finally, a rapid thermal annealing is performed at a higher temperature (for example, 750 to 900 degrees Celsius) to convert the metal silicide with high resistivity into a metal silicide with low resistivity. The metal silicide with low resistivity has a face-centered orthorhombic structure, so it has good thermodynamic properties and is very stable, and can reduce contact resistance between the drains and the bit line structures formed subsequently, thereby reducing a resistor-capacitor (RC) delay and improving a response speed of the semiconductor structure.

In embodiments of the disclosure, the semiconductor structure includes a plurality of memory cells. Each of the memory cells includes a double heterostructure 101, a double gate structure 107 located on part of each of the sidewalls of the double heterostructure 101, and a source and a drain located at two ends of the double heterostructure 101 in the Z-axis direction. Since the plurality of memory cells in the embodiments of the disclosure share one source. The preparation process of the semiconductor structure can be simplified and the manufacturing cost of the semiconductor structure can be reduced.

Figure 3A:
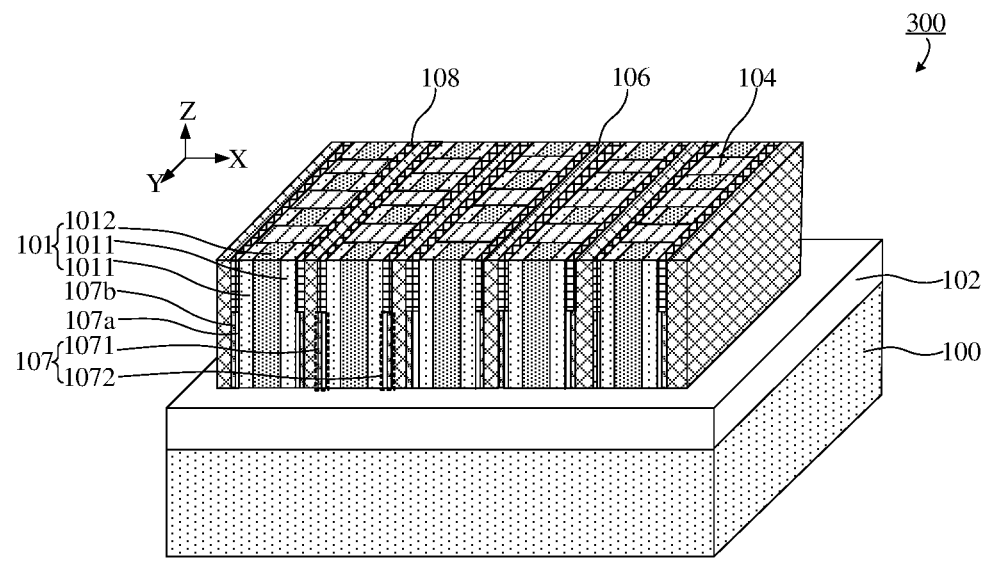
FIG. 3A is a first structural schematic diagram of a semiconductor structure provided by an embodiment of the disclosure.
Figure 3B:
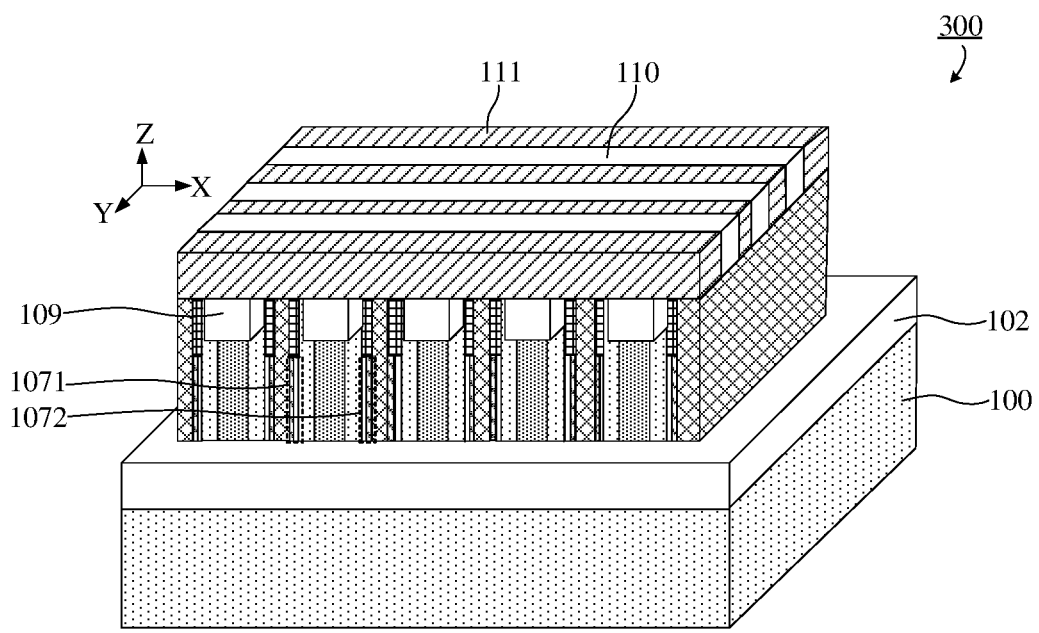
FIG. 3B is a second structural schematic diagram of a semiconductor structure provided by an embodiment of the disclosure.

The embodiments of the disclosure provide a semiconductor structure. FIGS. 3A and 3B are structural schematic diagrams of the semiconductor structure provided by embodiments of the disclosure. As shown in FIGS. 3A and 3B, the semiconductor structure 300 includes a substrate 100 and double gate structures 107.

The substrate 100 includes double heterostructures 101 arrayed along an X-axis direction and a Y-axis direction. Each of the double heterostructures 101 includes a first semiconductor layer 1011, a second semiconductor layer 1012, and another first semiconductor layer 1011 arranged sequentially along the X-axis direction. A forbidden band gap of the first semiconductor layer 1011 is different from a forbidden band gap of the second semiconductor layer 1012.

The double gate structure 107 is located on sidewalls of a corresponding one of the double heterostructures 101 along the first direction.

A working principle of a 1T0C memory is described below. Read and write functions of the memory include writing "0", writing "1", reading "0" and reading "1". There are four operations in the 1T0C memory to control storage states of a transistor and realize read and write functions. The four operations are erasing, programming, holding and reading, respectively. Accordingly, control voltages of ports of the transistor are shown in Table 1 below.

TABLE 1

Voltages of the transistor in the four operating states in 1T0C memory

|  | Programming | Erasing | Reading | Holding |
|---|---|---|---|---|
| Voltage (V) of the first gate structure | 1 | 1.5 | 0.8 | 0 |
| Voltage (V) of the drain | 1.2 | −1.5 | 0.2 | 0 |
| Voltage (V) of the second gate structure | −1.5 | −1.5 | −1.5 | −1.5 |

In a process of programming (that is, writing "1"), a voltage of the first gate structure is 1 V and a voltage of the drain is 1.2 V. The transistor conducts and generates a floating body memory cell in the first gate structure. Because the drain is at a high potential, electrons are injected from the source and reach the drain through the floating body memory cell. As electron-hole pairs are generated during acceleration of the electrons, when a voltage of −1.5 V is applied to the second gate structure, a large number of holes are adsorbed in the gate oxide layer in the second structure gate, which can be judged as writing "1".

In a process of erasing (i.e. writing "0"), the voltage of the first gate structure is 1.5 V, and the voltage of the drain is −1.5V. The floating body memory cell in the first gate structure is destroyed, and a reverse drain current is obtained, which is judged as writing "0".

In a process of reading "1", the voltage of the first gate structure is 0.8 V, and the voltage of the drain is 0.2 V. In this case, a greater drain current is obtained, which can be used to judge reading "1". In a process of reading "0", the floating body memory cell is destroyed, the voltage of the first gate structure is 0.8 V, and the voltage of the drain is 0.2 V. In this case, a lower drain current is generated, which can be used to judge reading "0".

In the above processes, in order to control the memory cell with floating body to be kept in an area where the first gate structure is located, the voltage of the second gate structure is kept at −1.5 V.

In the embodiments of the disclosure, on one hand, since forbidden band gaps of the first semiconductor layer 1011 and the second semiconductor layer 1012 forming each of the double heterostructures 101 are different, and the first semiconductor layers in the double heterostructure can be used as channels, the second semiconductor layer can be used as a trap to trap electrons or holes, thereby enabling the double heterostructure to be used as a charge storage bank. Therefore, redundant holes may be accumulated in a channel body of one gate structure in the double gate structure, which greatly increases a holding time, and further greatly enhances feasibility of 1T0C. On another hand, because the double heterostructures in the embodiments of the disclosure can be used as charge storage banks and can store data, there is no need to provide additional capacitors in the semiconductor structure, so that the integration of the semiconductor structure can be improved, and miniaturization can be realized.

In some embodiments, there are quantum wells in the double heterostructures 101, which can improve capability to trap charges, thereby achieving better charge storage effects.

In embodiments of the disclosure, referring further to FIGS. 3A and 3B, each of the double gate structures 107 includes a first gate structure 1071 and a second gate structure 1072. Each of the first gate structure 1071 and the second gate structure 1072 includes a gate oxide layer 107a and a gate conductive layer 107b.

The first gate structure 1071 in the double-gate structure 107 can be used as a traditional switching device, to control on and off of the transistor, and the second gate structure 1072 in the double-gate structure can generate a floating body memory cell. The memory cell operates by reversing voltage of the gate, such that operations of programming, erasing, reading and storing of data can be realized.

In some embodiments, each of the double heterostructures 101 includes two PN junctions of a same type. For example, the first semiconductor layers 1011 are P-type doped silicon layers and the second semiconductor layer 1012 is a P-type doped silicon germanium layer.

In the embodiment of the disclosure, both the first semiconductor layer and the second semiconductor layer are P-doped. Majority carriers of P-type doped semiconductors are holes, and channels storing charges can be increased.

In some embodiments, referring further to FIG. 3A, the semiconductor structure 300 further includes first isolation layers 104. Each of the first isolation layers 104 is located between two adjacent ones of the double heterostructures 101 along the second direction. The first isolation layer 104 is used to isolate the two adjacent double heterostructures 101, such that a situation that two adjacent double heterostructures 101 are conductive can be reduced, and performance of the semiconductor structure 300 can be improved.

In some embodiments, the semiconductor structure 300 further includes third isolation layers 108. The third isolation layers 108 are located on surfaces of the gate oxide layers 107a and the gate conductive layers 107b. Surfaces of the third isolation layers 108 are flush with surfaces of the double heterostructures 101. Top surfaces of the third isolation layers 108 are flush with top surface of the double heterostructures 101 (or the first isolation layers 104 or the second isolation layers 106), so that a surface of the semiconductor structure 300 formed is planar, which facilitates a subsequent formation of other structures on the surface of the semiconductor structure 300.

In some embodiments, referring further to FIG. 3A, the semiconductor structure 300 further includes second isolation layers 106. The second isolation layers 106 is located between a first gate structure 1071 of one of two adjacent double heterostructures and a second gate structure 1072 of the other one of the two adjacent double heterostructures, and between two corresponding ones of the third isolation layers 108. Surfaces of the second isolation layers 106 are flush with the surfaces of the third isolation layers 108.

In embodiments of the disclosure, on one hand, the second isolation layer 106 can be used to isolate the adjacent gates in the double gate structures, so as to reduce a situation that adjacent gate structures are conductive, and then realize control of a single transistor. On the other hand, the second isolation layer 106 can also realize the isolation between the double gate structures 107 and the subsequently formed bit line structures.

In some embodiments, referring further to FIGS. 3A and 3B, the substrate 100 also includes a source layer 102. The source layer 102 forms the source of the semiconductor structure 300 and the double heterostructures 101 are located on a surface of the source layer 102.

In some embodiments, referring further to FIG. 3B, the semiconductor structure 300 further includes drains 109 and bit line structures 111. A drain 109 is located at one end of each of the double heterostructures 101 away from the source layer 102. The bit line structures 111 are arranged along the Y-axis direction and extend along the X-axis direction. The bit line structures 111 are connected to the drains 109.

In embodiments of the disclosure, the bit line structures 111 can transfer data, thereby enabling the memory cells to read data from or store data into the charge storage banks in the double heterostructures. A second isolation layer 106 and third isolation layers 108 may be provided between two adjacent ones of the drains 109 in the X-axis direction. An isolation structure between two adjacent drains 109 in the X-axis direction may be a nitride-oxide-nitride (i.e., N—O—N) structure or an oxide-nitride-oxide (i.e., O—N—O) structure, or the like, to reduce an parasitic capacitance between the double gate structures 107 and the drains 109, thereby improving a response speed of the semiconductor structure.

In some embodiments, referring further to FIG. 3B, the semiconductor structure 300 further includes a fourth isolation layer 110 located between two adjacent ones of the bit line structures 111. As shown in FIG. 3B, the bit line structures 111 and the fourth isolation layers 110 are arranged in a same direction and extend in another same direction.

In some embodiments, a material of the source layer includes silicon phosphide. In some other embodiments, the source layer may also be of a semiconductor material containing a VA group ion such as arsenic or antimony.

In embodiments of the disclosure, the material of the source layer 102 includes silicon phosphide, so that the source layer 102 can have a lower resistance and a higher electrical conductivity, thereby improving the electrical conductivity of the semiconductor structure 300.

In some embodiments, the semiconductor structure 300 may further include a connection layer (not shown) located between the bit line structure 111 and corresponding drains 109.

In embodiments of the disclosure, the connection layers may be of a metal silicide, which can reduce a contact resistance between the drain 109 and the bit line structure 111, thereby reducing a RC delay and improving a response speed of the device.

The semiconductor structure provided by the embodiment of the disclosure is similar to the structures formed by the method for forming the semiconductor structures in the above-mentioned embodiments. For technical features not disclosed in detail in the embodiments of the disclosure, refer to the above-mentioned embodiments for understanding, and the features are not repeated here.

In the embodiments provided by the disclosure, it is to be understood that the disclosed devices and methods may be implemented in a non-target manner. The embodiments of the device described above are only schematic. For example, the division of the unit is only a logical function division, and there may be another division mode in actual implementation, such as: multiple units or components can be combined, or integrated into another system, or some features can be ignored or not executed. In addition, the components shown or discussed are coupled with each other, or directly coupled.

The features disclosed in the several embodiments of methods or devices provided by the disclosure can be arbitrarily combined without conflict, in order to obtain a new embodiment of a method or of a device.

The above are only some embodiments of the embodiments of the disclosure, but the scope of protection of embodiments of the disclosure is not limited thereto. Changes or replacements within the technical scope disclosed by embodiments of the disclosure, thought easily by any technician familiar with the technical field, should be covered within the scope of protection of the embodiments of the disclosure. Therefore, the scope of protection of embodiments in this disclosure shall be subject to the scope of protection of the claims.

What is claimed is:

1. A method for forming a semiconductor structure, comprising:
    providing a substrate, wherein the substrate comprises double heterostructures arrayed along a first direction and a second direction; each of the double heterostructures comprises a first semiconductor layer, a second semiconductor layer and another first semiconductor layer sequentially arranged along the first direction; a forbidden band gap of the first semiconductor layer is different from a forbidden band gap of the second semiconductor layer; the first direction is perpendicular to the second direction, and both the first direction and the second direction are parallel to a plane where the substrate is located; and
    forming a double gate structure on sidewalls of each of the double heterostructures along the first direction;
    wherein the substrate further comprises a source layer, the source layer forms a source of the semiconductor structure; the double heterostructures are formed on a surface of the source layer in the Z-axis direction, the double heterostructures share one source; and the double heterostructures are formed by:
    forming initial double heterostructures arranged at intervals along the first direction on the surface of the source layer; and
    etching the initial double heterostructures by a self-aligned double patterning technique or a self-aligned quadruple patterning technique, to form the double heterostructures arrayed along the first direction and the second direction.

2. The method of claim 1, wherein
quantum wells are in the double heterostructures.

3. The method of claim 1, wherein
the forming initial double heterostructures comprises:
    forming initial second semiconductor layers arranged along the first direction and extending along the second direction on the surface of the source layer; and forming initial first semiconductor layers on sidewalls of the initial second semiconductor layers epitaxially along the first direction to form the initial double heterostructures.

4. The method of claim 1, wherein
the first semiconductor layer is a P-type doped silicon layer, and the second semiconductor layer is a P-type doped silicon germanium layer.

5. The method of claim 1, wherein
after forming the initial double heterostructures and before forming the double heterostructures, the method further comprises:
forming a first sacrificial layer between two adjacent ones of the initial double heterostructures.

6. The method of claim 5, wherein
after forming the double heterostructures, the method further comprises:
forming a first isolation layer between two adjacent ones of the double heterostructures along the second direction; and
removing first sacrificial layers.

7. The method of claim 6, wherein
the forming a double gate structure on sidewalls of each of the double heterostructures along the first direction comprises:
forming second sacrificial layers on the sidewalls of the double heterostructures and side walls of first isolation layers;
forming a second isolation layer between two adjacent ones of the second sacrificial layers;
removing the second sacrificial layers to form gate trenches; and
forming double gate structures in the gate trenches.

8. The method of claim 7, wherein
each of the double gate structures comprises a first gate structure and a second gate structure, and the forming double gate structures in the gate trenches comprises:
forming initial gate oxide layers on the sidewalls of the double heterostructures;
forming initial gate conductive layers in the gate trenches having the initial gate oxide layers; and
etching back the initial gate oxide layers and the initial gate conductive layers to expose part of the sidewalls of the double heterostructures, part of sidewalls of the first isolation layers and part of sidewalls of the second isolation layers and form isolation grooves and the first gate structures and the second gate structures, wherein both the first gate structure and the second gate structure are composed of a gate oxide layer and a gate conductive layer.

9. The method of claim 8, wherein
after forming the double gate structures, the method further comprises:
forming third isolation layers in the isolation grooves.

10. The method of claim 9, further comprising:
forming a drain at an end of each of the double heterostructures away from the source layer; and
forming bit line structures connected to the drains.

11. The method of claim 10, wherein
the forming bit line structures connected to the drains comprises:
forming a fourth initial isolation layer on surfaces of the first isolation layers, the second isolation layers, the third isolation layers and the drains;
etching the fourth initial isolation layer to form bit line trenches arranged along the second direction and extending along the first direction, wherein the bit line trenches expose the drains, part of the second isolation layers, and part of the third isolation layers; and
forming the bit line structures in the bit line trenches.

12. The method of claim 10, further comprising:
forming a connection layer between a bit line structure and corresponding drains.

13. A semiconductor structure, comprising:
a substrate comprising double heterostructures arrayed along a first direction and a second direction; each of the double heterostructures comprises a first semiconductor layer, a second semiconductor layer, and another first semiconductor layer sequentially arranged along the first direction, a forbidden band gap of the first semiconductor layer is different from a forbidden band gap of the second semiconductor layer, the first direction is perpendicular to the second direction, and both the first direction and the second direction are parallel to a plane where the substrate is located; and
a double gate structure located on sidewalls of each of the double heterostructures along the first direction;
wherein the substrate further comprises:
a source layer, wherein the source layer forms a source of the semiconductor structure, and the double heterostructures are located on a surface of the source layer in a Z-axis direction, the double heterostructures share one source.

14. The semiconductor structure of claim 13, wherein
the double gate structure comprises a first gate structure and a second gate structure, and both the first gate structure and the second gate structure comprise a gate oxide layer and a gate conductive layer.

15. The semiconductor structure of claim 14, further comprising:
first isolation layers, wherein a first isolation layer is located between two adjacent ones of the double heterostructures along the second direction.

16. The semiconductor structure of claim 15, further comprising:
third isolation layers, wherein the third isolation layers are located on surfaces of gate oxide layers and gate conductive layers, and surfaces of the third isolation layers are flush with surfaces of the double heterostructures.

17. The semiconductor structure of claim 16, further comprising:
second isolation layers, wherein a second isolation layer is located between the first gate structure of one of two adjacent double heterostructures and the second gate structure of anther one of the two adjacent double heterostructures, and between two corresponding third isolation layers; and
wherein surfaces of the second isolation layers are flush with the surfaces of the third isolation layers.

18. The semiconductor structure of claim 13, further comprising:
drains, wherein a drain is located at an end of a corresponding double heterostructure away from the source layer; and
bit line structures, wherein the bit line structures are arranged along the second direction and extend along the first direction; the bit line structures are connected with the drains.

* * * * *